United States Patent [19]

Grandfield et al.

[11] Patent Number: 4,928,314
[45] Date of Patent: May 22, 1990

[54] HETERODYNE STAGE HAVING PRECISE CLOSED-LOOP CONTROL OF THE AMPLITUDE OF THE INJECTION SIGNAL THEREOF

[75] Inventors: Walter J. Grandfield, Lake Worth; James G. Mittel, Boynton Beach; Walter L. Davis, Coral Springs, all of Fla.

[73] Assignee: Motorola, Inc., Schaumburg, Ill.

[21] Appl. No.: 302,701

[22] Filed: Jan. 27, 1989

[51] Int. Cl.$^5$ ............................................. H04B 1/26
[52] U.S. Cl. .................................... 455/236; 455/317; 455/318; 455/319; 455/323; 331/109; 331/183
[58] Field of Search ............... 455/343, 236, 316, 317, 455/318, 319, 323; 331/109, 183

[56] References Cited

U.S. PATENT DOCUMENTS

| 3,764,917 | 11/1973 | Rhee | 331/183 |
| 4,528,698 | 7/1985 | Fraser | 455/319 |
| 4,609,884 | 9/1986 | Kindinger et al. | 331/183 |

FOREIGN PATENT DOCUMENTS 0214491  3/1987  European Pat. Off. ............ 455/236

Primary Examiner—Joseph A. Orsino
Assistant Examiner—Kinfe-Michael Negash
Attorney, Agent, or Firm—William E. Zitelli; Vincent B. Ingrassia

[57] ABSTRACT

A heterodyne stage of a receiver which includes a conventional mixer circuit and local oscillator circuit further includes a differential amplifier circuit which measures the amplitude of the injection signal generated by the local oscillator circuit and controls it precisely to a desired reference level by adjusting the current bias supply to the local oscillator circuit within a banded range to ensure start-up of the local oscillator upon energization and to protect against loss of injection signal under all operating conditions. The differential amplifier circuit provides for a precise amplitude reference setting and sufficient closed-loop gain for controlling the amplitude of the injection signal with a minimum of error between the measured and reference values.

10 Claims, 4 Drawing Sheets

HETERODYNE STAGE HAVING PRECISE CLOSED-LOOP CONTROL OF THE AMPLITUDE OF THE INJECTION SIGNAL THEREOF

BACKGROUND OF THE INVENTION

The present invention is directed to a heterodyne stage of a radio or pager receiver, and more particularly, to a closed-loop control circuit for use therein in controlling the bias current of a local oscillator within a banded range to render the injection signal thereof precisely at a desired amplitude.

A heterodyne stage of a radio or pager receiver includes a local oscillator which generates an injection signal at a predetermined frequency and at an amplitude that is proportional to the amount of bias current supplied to the oscillator, and a mixer circuit which is governed by the injection signal of the local oscillator to convert a mixer input signal at one frequency to a mixer output signal at another frequency based on the frequency of the injection signal. Normally, in a receiver heterodyne stage, the frequency of the injection signal is subtracted from the frequency of the input signal to the mixer to render an output signal of the mixer at a frequency substantially corresponding to the resulting frequency difference. A receiver of the aforementioned type may include one or more heterodyne stages for converting received radio frequency or RF signalling to an intermediate frequency or IF and possibly to convert one IF signal to another lower IF signal for utilization by further downstream circuitry.

Receivers of the portable variety are battery powered and thus considerable emphasis is placed on conserving power consumption by such receivers to extend the usable operating life thereof without having to recharge or replace its batteries. To this end, some more recent portable receiver units have included power conservation measures which are designed to de-energize certain circuits of the receiver when not needed and then re-energize them according to demand. It is always of some concern in the transition from de-energization to re-energization that each of the circuits restart and operate at designed performance levels in a short time interval.

For example, restarting a crystal-controlled local oscillator circuit requires approximately on the order of twice the bias current than what is needed after the oscillator circuit reaches steady state conditions. Accordingly, what is desired is to provide a large amount of bias current to the oscillator circuit initially upon re-energization and then adjust back to the minimum bias current needed to sustain the oscillator injection signal at a desired amplitude while operating under steady state conditions. The problem is that it is not always easy to estimate these two bias current level extremes under all working conditions. Selecting current levels that are too high may result in unpredictable oscillator performance, as well as excessive gain in the mixer stage and undesirable consumption of power from the battery which will decrease the operational battery life of the receiver. Selecting too low a level may cause the oscillator not to restart upon re-energization or to cause the amplitude of the injection signal to fall below operational limits, resulting in degraded mixer performance.

One solution to ensuring proper restart of the oscillator circuit and protecting against loss of the injection signal is to provide a closed feedback loop at the heterodyne stage to control the bias current to the oscillator circuit in accordance with a desired injection signal amplitude. Such a solution is proposed in U.S. Pat. No 3,805,162 issued Apr. 16, 1974 to Clive Hoffman et al. which patent being assigned to the same assignee as the instant application. The proposed circuit of the Hoffman et al. patent is directed to detecting an oscillator injection signal amplitude and setting a desired amplitude thereof based on the difference between base-emitter voltages of a mixer transistor having high frequency operational characteristics and a control stage transistor having lower frequency operational characteristics. While the proposed closed loop control circuitry of Hoffman et al. is considered adequate for many operational conditions, it is believed not without need of improvement.

Some factors which must always be considered in evaluating such types of feedback control loop circuits are: (1) the ability to measure the amplitude of the injection signal undistorted by extraneous signals such as broadband RF signalling provided at a first heterodyne stage operational at the input of such a receiver unit, (2) the ability to set a precise reference level for controlling the amplitude of the injection signal to the mixer such that it does not deviate substantially during the heterodyne operation of the mixer circuit, and (3) to ensure that the closed-loop control circuit operates within a bounded bias current range to sustain oscillator operation even under extreme abnormal operating conditions.

In the present invention, these and other factors are provided for in a closed-loop control circuit for controlling the oscillator injection signal to a desired amplitude by adjusting the bias current to the oscillator circuit in a heterodyne stage. The advantages of Applicants' invention over the prior art will become more evident from the following description of preferred embodiments and accompanying drawings.

SUMMARY OF THE INVENTION

In accordance with the present invention, a heterodyne stage of a receiver comprises a local oscillator circuit which is responsive to bias current supplied from a bias current source for generating an injection signal which governs a mixer circuit to convert a receiver signal from one frequency to another frequency by a heterodyning process, and a differential amplifier circuit having one transistor stage input coupled to a measurement of the amplitude of the injection signal to effect a signal representative thereof and another transistor stage input biased at a reference level and including a circuit stage governed by the amplitude representative signal and the reference level to adjust the amount of bias current supplied to the oscillator circuit by the bias current source within a non-zero bias current range.

In one embodiment of the present invention, the injection signal is coupled directly from the local oscillator circuit to the one transistor stage input of the differential amplifier circuit. In this embodiment, the bias current source includes a current mirror circuit disposed in a supply line between a governing current source and the local oscillator circuit, said governing current source setting the maximum amount of bias current to be supplied to the local oscillator by the bias current source. The current stage of the differential amplifier is coupled to the supply line for diverting thereto a portion of the governing current, thus decreasing the bias current supply to the local oscillator circuit through the current mirror circuit. In this manner, the bias current supplied to the local oscillator is controlled within a banded range to ensure performance of the local oscillator under all operating conditions.

In another embodiment of the present invention, the measurement of the injection signal amplitude is taken from the delta current signal of the mixer circuit and coupled to the one transistor stage input of the differential amplifier circuit. The current mirror circuit of the bias current source is biased to supply a minimum amount of bias current to the local oscillator circuit. In this embodiment, the circuit stage of the differential amplifier circuit adjusts the amount of bias current supplied to the local oscillator from a minimum amount to a maximum amount which is set by the circuit stage. Accordingly, the bias current is adjusted within a banded range to control the injection signal at a desired amplitude.

In both of the foregoing described embodiments, a precise reference level and sufficient closed-loop gain are provided by the differential amplifier circuit in each case to control the injection signal precisely at a desired amplitude set by the reference level.

DESCRIPTION OF THE PREFERRED EMBODIMENTS

Figure 1:
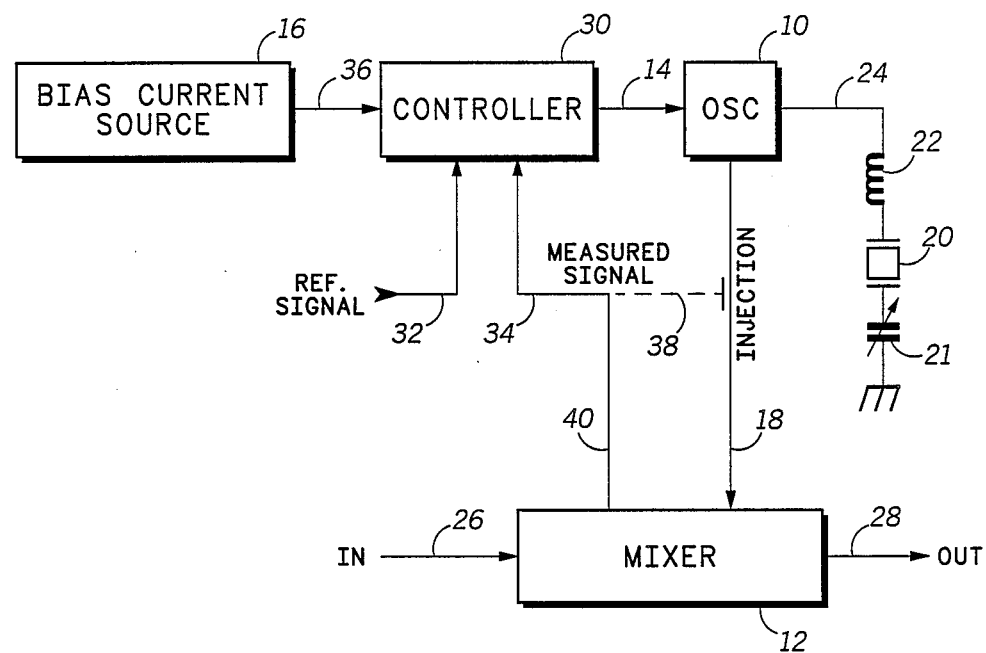
FIG. 1 is a functional block diagram schematic of a heterodyne stage suitable for embodying the broad principles of the present invention.

FIG. 1 is a functional block diagram of a heterodyne stage of a radio or pager receiver and includes the conventional elements of a local oscillator circuit shown at block 10 and a mixer circuit shown at block 12. The oscillator circuit 10 is responsive to bias current supplied over line 14 from a bias current source 16 to generate an injection signal over line 18 at a predetermined frequency and an amplitude based on the amount of bias current supplied over line 14. The oscillator circuit 10 may be of the crystal controlled variety in which case a crystal 20 configured in a network of reactive tuning elements 21 and 22 governs the oscillator 10 with a tuned frequency signal over signal line 24. The mixer circuit 12 is governed by the injection signal 18 to convert a receiver signal over line 26 from one frequency to another frequency by using a well-known heterodyning process and the resultant receiver signal at the other frequency is output over signal line 28. The block 30 represents a closed-loop control circuit which is governed by a reference signal 32 and a measured signal 34 to adjust the amount of bias current supplied to the oscillator circuit 10 over line 14 from the bias current source 16 over line 36. The measured signal 34 may be the injection signal 18 itself as indicated by the dashed line 38 or it may be derived from a parameter 40 of the mixer circuit 12 which parameter being representative of the injection signal 18.

In operation, the controller 30 measures the amplitude of the injection signal as provided by the injection signal line 38 or a parameter measured from the mixer circuit over signal line 40 and compares that measurement with a reference level derived from the reference signal 32. In the event that the measured signal falls below the reference level, the bias current supplied to the oscillator circuit 10 is increased causing a proportional increase in the amplitude of the injection signal. Conversely, when the measured signal climbs above the reference level, the bias current supplied to the oscillator circuit 10 is decreased by the controller 30 causing the amplitude of the injection signal to decrease commensurately therewith.

Figure 2:
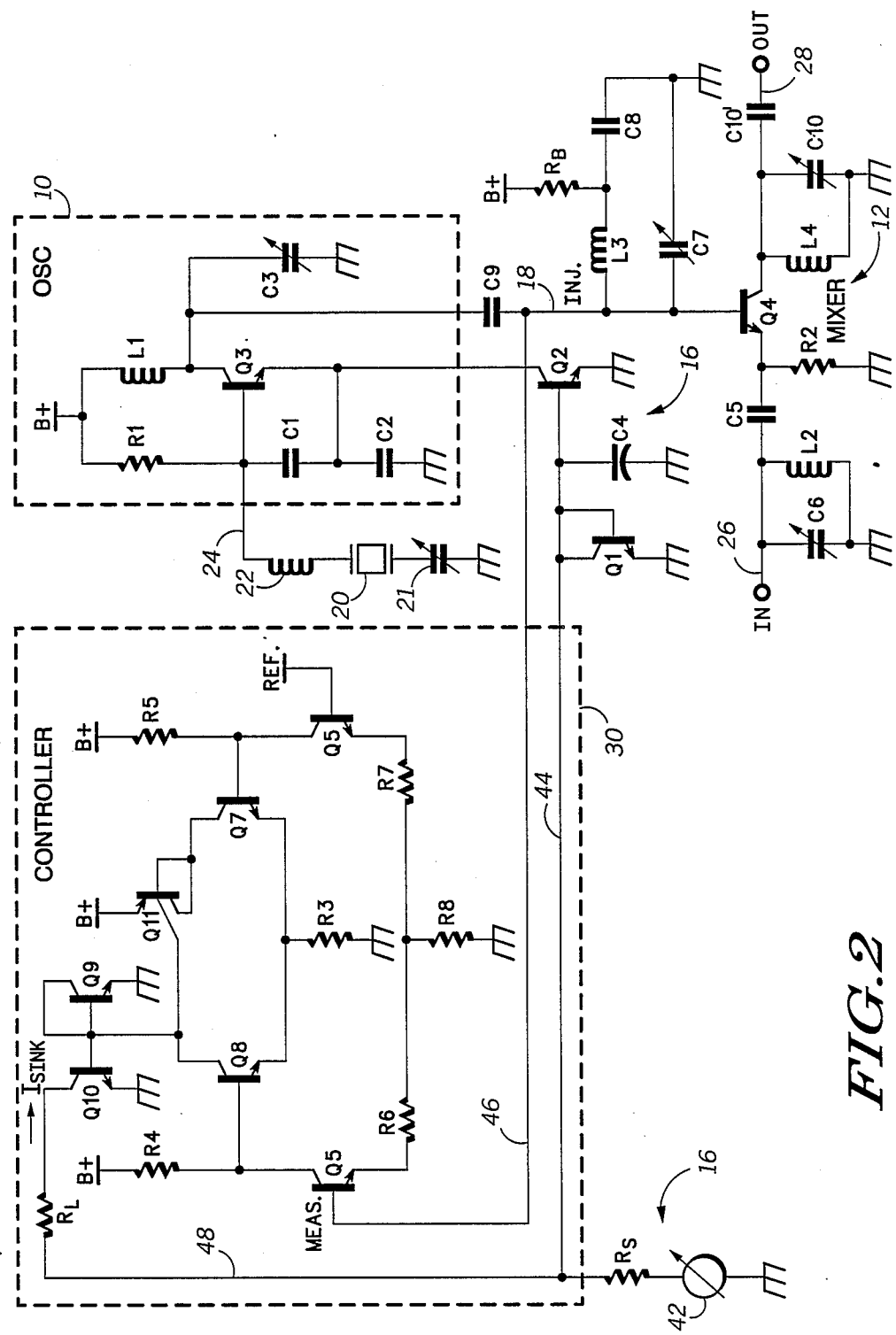
FIG. 2 is a circuit schematic of one embodiment suitable for implementing aspects of the present invention.
Figure 3:
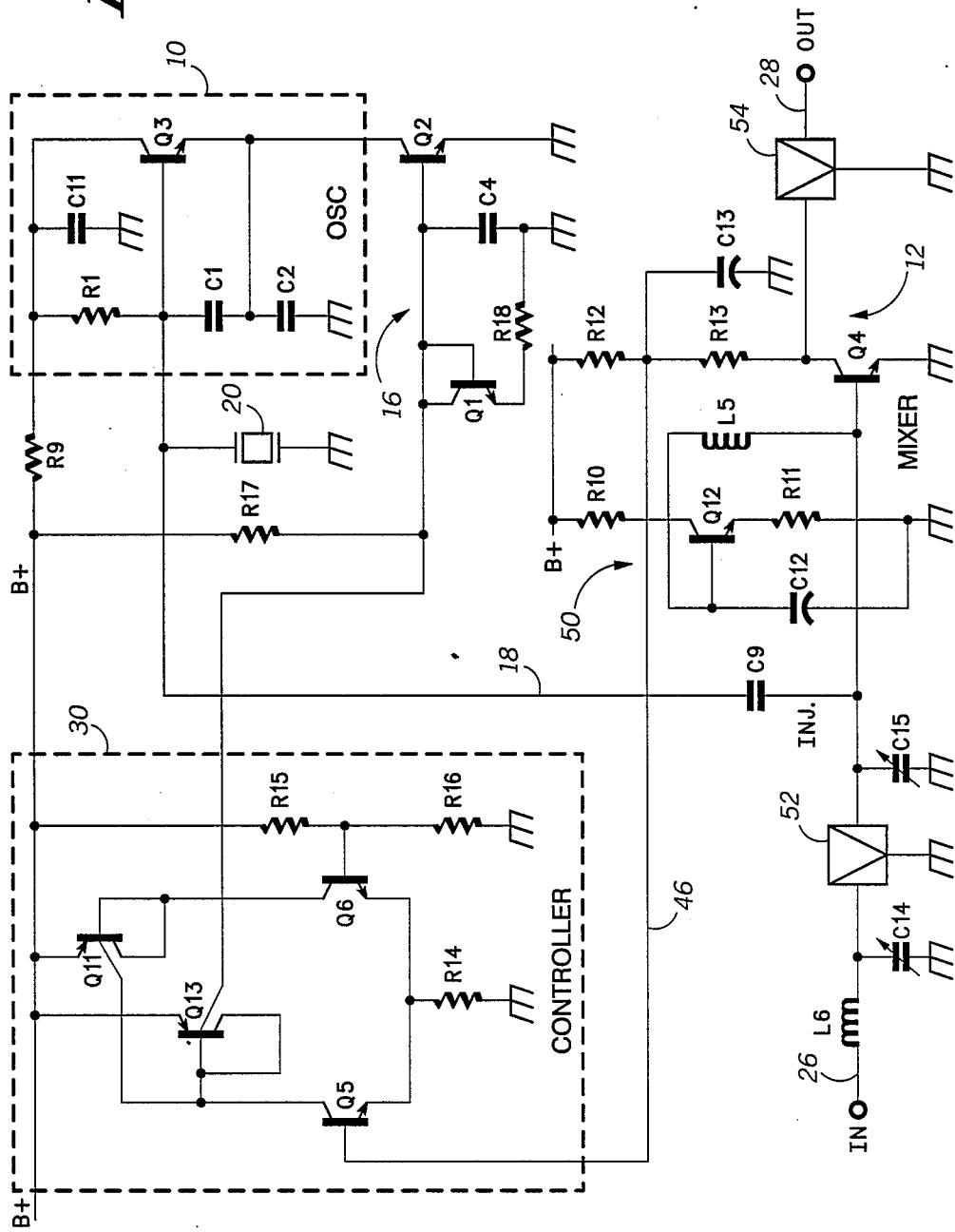
FIG. 3 is a circuit schematic of another embodiment which is suitable for implementing further aspects of the present invention.

The circuit details of an oscillator circuit 10, a mixer 12, a controller 30, and current source 16 are shown in two separate embodiments depicting respectively in FIGS. 2 and 3. All of the transistor and resistor elements of the embodiments of FIGS. 2 and 3 may be constructed on the same substrate of an integrated circuit for each case and the reactive components of inductors and capacitors may be externally coupled respectively to their associated integrated circuit. Each integrated circuit may be manufactured by Motorola's Semiconductor Division using the well known semiconductor manufacturing process known as MOSAIC 1.5, for example. Reference is made to the Motorola publication "Linear and Interface Integrated Circuits", DL128, Rev. 2, pp. 1–8, for a more detailed description of this type manufacturing process. As a result of the integrated circuit implementation and certain trimming steps which are a part of the manufacturing process thereof, the characteristic parameters of the transistor and resistor components may be more precisely related to one another. In addition, better performance is expected from an integrated circuit implementation than that which would be expected from a circuit comprising discrete components. With that all said and done, it is now time to describe the respective circuit embodiments.

Referring to FIG. 2, the symbol B+ shown throughout the circuit depiction represents the power supply potential which is provided from a battery source (not shown) and regulated to approximately 1 volt, for example, for both of the present embodiments. Continuing, the local oscillator circuit shown in the dot dashed lines of block 10 is a conventional Colpitts configuration including an NPN transistor Q3 having its collector coupled to the B+ supply through an inductive element L1. The base of Q3 is coupled to the crystal tuned frequency signal line 24, to the B+ supply through a resistor R1 and to ground potential through a capacitor divider network comprising capacitive elements C1 and C2. The node connection between C1 and C2 is coupled to the emitter of the transistor Q3. For frequency tuning purposes, a variable capacitor C3 is coupled from the collector of Q3 to ground potential.

In the present embodiment, a bias current source 16 comprises in part a voltage source shown at 42 coupled in series with a resistor Rs. The voltage source 42 may be fixed at the B+ supply, for example, or variable, as the case may be. The governing current supplied through Rs is conducted over a supply line 44 to a current mirror circuit configuration comprising the transistors Q1 and Q2 which are also a part of the bias current source 16. More specifically, the supply line 44 is coupled to both the collector and base of transistor Q1 which has its emitter coupled to ground potential and is also coupled to the base of transistor Q2 which has its collector coupled to the emitter of transistor Q3 in the oscillator circuit 10 and also has its emitter coupled to ground potential. In the present embodiment, the device geometries of the transistors Q1 and Q2 are designed to provide a current mirror ratio of 10-12 to 1; thus, the current flow through transistor Q2 is 10 or 12 times the amount of current flowing through transistor Q1 which is the control or bias current generated by the controller. A capacitor C4 may be coupled from the base of transistors Q1 and Q2 to ground potential to offer an enhancement to noise immunity and control circuit stabilization.

The operation of a Colpitts oscillator is considered well known to anyone skilled in the pertinent art, the details of which contributing nothing to the present invention other than the fact that as more bias current is drawn from transistor Q3 through transistor Q2 as a result of the current mirror configuration of Q1 and Q2, the oscillator gain and the amplitude of the generated injection signal over signal line 18 will both increase and conversely, as less bias current is drawn, the oscillator gain and injection amplitude will both decrease. Accordingly, the amplitude of the injection signal 18 may be adjusted in accordance with the amount of bias current drawn through transistor Q2.

The mixer circuit shown at 12 comprises a conventional single NPN transistor stage Q4 connected in a common base configuration. The mixer input signal which may be of a broadband, radio frequency variety may be AC coupled to the emitter of the mixer transistor Q4 through a capacitive element C5. A conventional LC tuning and impedance network comprising the paralleled capacitive and inductive elements C6 and L2, respectively, is provided at the input side of capacitor C5 and coupled conventionally to ground potential. The emitter of transistor Q4 is DC biased through resistor R2. Another conventional LC tuning and impedance matching network comprising the reactive capacitive and inductive elements C7, C8, and L3 are coupled between the base of Q4 and ground potential. The node connection between L3 and C8 may be coupled to B+ through a resistor RB. The injection signal generated from the oscillator circuit 10 over line 18 is AC coupled to the base of the mixer transistor Q4 through a capacitive element C9. The mixer stage 12 includes an additional LC tuning and matching network comprising capacitive and inductive elements C10, C10', and L4, respectively, which is coupled at the collector of Q4 to ground potential and offers selective tuning and AC coupling for the output signal from the collector of Q4 to the output line 28.

In operation, the mixer input signal may be selectively filtered by the tuning circuit L2 and C6 to pass only frequencies within a desirable frequency range through capacitive element C5. The heterodyne mixing operations occur between the filtered mixer input signal and injection signal in the base emitter junction of the mixer transistor Q4 with the resulting frequency converted signal appearing at the collector of Q4 and being filtered by the tuning network C10 and L4 and AC coupled by C10' to the output line 28. The LC tuning circuit comprising the elements C7, C8 and L3 at the base of Q4 substantially attenuates signals having frequencies other than the frequency of the injection signal and thus, substantially minimizes distortion to the injection signal over the signal line 18 caused by the heterodyne mixing process and/or the magnitude of the RF mixer input signal, thus providing an essential distortion free injection signal at the point 18.

In accordance with the present invention, a closed loop control circuit 30 is disposed in the heterodyne stage embodiment of FIG. 2 to control the injection signal at a desired amplitude by adjusting the bias current supplied to the oscillator circuit 10 from the bias current source 16. The circuit of controller 30 is configured as a differential amplifier including the transistor stage inputs of Q5 and Q6. The addition of transistors Q7 and Q8 in the differential amplifier circuit provide for dual differential amplification which provides adequate gain to allow for minimum closed-loop error between the reference and measured amplitudes while minimizing the current drain on the battery source, i.e. B+ supply. Current is supplied to the collectors of NPN transistors Q8 and Q7 through a dual collector PNP transistor Q11 configured as a current mirror circuit having one collector tied to its own base and the collector of Q7 and the other collector tied to the collector of Q8, the emitter of Q11 being coupled to the B+ supply. The emitters of transistors Q8 and Q7 are commonly coupled through a resistor R3 to ground potential and the bases thereof are respectively coupled to the collectors of transistors Q5 and Q6 which collectors also being respectively coupled through the resistors R4 and R5 to the B+ supply. The emitters of transistors Q5 and Q6 are coupled through respective resistors R6 and R7 to a common resistor R8 which is coupled to ground potential.

A signal line 46 couples the injection signal from the line 18 to the base of the input stage transistor Q5. The base of the other input stage transistor Q6 may be coupled to a reference potential or the B+supply as the case may be. The transistor Q6 is constructed to have an IC area which may be, for example, on the order of eight times that of the IC area of Q5 in order to establish a reference level between the input transistor stages. It is a well-known principle that an IC area differential between transistors establishes a base-emitter junction voltage differential between the transistors which sets a reference voltage threshold level. In the preferred embodiment, the eight times area factor results in a threshold level of 54 millivolts. That is, the differential amplifier will be in a balanced condition when the voltage on the base of Q5 is 54 millivolts above the voltage of the base of Q6.

A current mirror circuit stage is coupled to the differential amplifier at the collector of the transistor Q8 and to the governing current supply line 44 to divert governing current from the supply line. More specifically, the current mirror circuit stage comprises NPN transistors Q9 and Q10 having their bases tied together and their emitters both coupled to ground potential with the common base connection node being coupled to the collector of Q8 and also to the collector of Q9. The collector of Q10 is coupled to the supply line 44 through a current limiting resistor RL In addition, the IC area of transistor Q10 may be on the order of eight times that of the IC area of transistor Q9 which permits the current diverted from the supply line 44 to be substantially greater than that flowing through transistor Q9.

In operation, the input transistor stage Q5 of the control circuit 30 measures the amplitude of the injection signal from the supply line 18 at the base of Q4. More specifically, the base-emitter junction of transistor Q5 rectifies and averages the injection signal to effect a signal which is representative of the amplitude thereof which is then compared to the reference level set for the desired amplitude of the injection signal. When the measured signal is below the reference level, transistors Q5 through Q11 operate cooperatively to limit the current passing through transistor Q9 which in turn limits the current diverted from the supply line through transistor Q10, thus rendering higher bias current via current mirror Q1–Q2 to the oscillator 10 to cause it to increase the amplitude of the injection signal. Should the measured signal exceed the reference level, then the transistors Q5 through Q11 operate in a fashion to cause increased current to flow through transistor Q9 of the current mirror circuit which results in a higher current diversion from the governing current supply line 44 through transistor Q10, rendering less bias current to the oscillator circuit 10, thereby causing a lower injection signal amplitude. Of course, once brought to steady state conditions, the controller circuit 30 is provided with sufficient gain to sustain the amplitude of the injection signal substantially at the desired amplitude level as set by the precise reference level between the input transistor stages Q5 and Q6.

The current mirror circuit comprising transistors Q9, Q10 and limiting resistor RL is designed to divert only a portion of the governing current from supply line 44, thus ensuring that the closed-loop control circuit 30 adjusts the amount of bias current supplied to the oscillator circuit 10 only within a non-zero bias current range. This characteristic of the control circuit 30 ensures against loss of oscillator signal during all operating conditions.

It is recognized that during power saving operations where the oscillator circuit may be de-energized and then re-energized by the B+supply line, the bias current supply to the oscillator circuit will continue to be controlled by controller 30 in a closed-loop fashion using the feedback measurement of the injection signal as a guide to determine the required minimum amount of bias current needed by the oscillator circuit. During start-up, when the injection signal level is essentially zero, all of the current available from the bias current source is applied to the oscillator to minimize the start-up time. Accordingly, start-up of the oscillator circuit 10 is assured and once steady-state conditions thereof prevail, only the minimum necessary amount of bias current is supplied to the oscillator circuit to maintain the injection signal at its desired amplitude setting.

Typical values for the circuit components of the embodiment of FIG. 2 are shown in the following table:

TABLE 1

| Element | Value |
| --- | --- |
| R1 | 4K ohms |
| R2 | 550 ohms |
| R3 | 6K ohms |
| R4 | 24K ohms |
| R5 | 24K ohms |
| R6 | 2K ohms |
| R7 | 2K ohms |
| R8 | 16K ohms |
| Rs | 3K ohms |
| C1 | 19 pf |
| C2 | 36 pf |
| C3 | 5–35 pf (trimmer) |
| C4 | .05 uf |
| C5 | 1000 pf |
| C6 | 5–35 pf (trimmer) |
| C7 | 5–35 pf (trimmer) |
| C8 | 220 pf |
| C9 | 220 pf |
| C10 | 5–35 pf (trimmer) |
| L1 | 70 nH |
| L2 | 70 nH |
| L3 | 70 nH |
| L4 | 2.6 uH |
| 20 | 51 MHz (3rd overtone) |
| 21 | 5–35 pf (trimmer) |
| 22 | 1.2 uH |

The foregoing described heterodyne stage embodiment depicted in FIG. 2 has primary application to a first stage heterodyning process dealing with received broadband RF signalling. An alternate embodiment of a heterodyne stage embodying the principles of the present invention which will be described in connection with that shown in FIG. 3 has primary application to a second heterodyne stage of a receiver in which IF signalling is converted from one frequency to another. The receiver IF signalling input to a second heterodyne stage has a much narrower bandwidth and limited power level than that of the RF signalling input to the first heterodyne stage, enabling a more beneficial measuring point of the injection signal. Much of that depicted in FIG. 3 is substantially similar to the embodiment described in connection with FIG. 2. Accordingly, reference numerals for common or substantially equivalent components will be maintained between the two embodiments; however, it should be understood that while the same or similar components may be performing same or similar functions, their values in the alternate embodiment may be changed due to different design considerations.

Referring to FIG. 3, the oscillator circuit 10 remains crystal controlled for this embodiment and is of the same Colpitts design; however, because the application is primarily directed to a second heterodyne stage, the frequency of the injection signal generated thereby will be at a much lower value and thus may require fewer reactive tuning components. Nevertheless, the functioning thereof is substantially similar to that described in connection with the oscillator circuit 10 of FIG. 2. The addition of resistor R9 and capacitor C11 provides a decoupling of the B+ supply from the oscillator circuit 10.

The mixer 12 similarly comprises a single stage NPN transistor Q4, but in this alternate embodiment, it is configured in a common emitter arrangement with the emitter thereof coupled to ground potential. The mixer 12 of this alternate embodiment further includes a current mirror circuit shown at 50 comprising an NPN transistor Q12 having its collector tied to its base and also to the B+ supply through a resistor R10 and having its emitter coupled to ground through a resistor R11. To protect against noise and unwanted signal coupling, a capacitor C12 is coupled between the base of Q12 and ground potential. An inductor component L5 is coupled between the collector of Q12 and base of Q4 to provide a DC bias current path to Q4 while highly attenuating the high frequency signals at the base of Q4.

Note that the mixer input signal over line 26 and the injection signal over line 18 are combined at the base of Q4 and that the base emitter junction of Q4 is still used to perform the heterodyning process. The resultant difference frequency signal is provided at the collector of Q4 and coupled to the output line 28. A resistor divider network comprising resistors R12 and R13 is coupled between the collector of Q4 and the B+ supply and a capacitor C13 is coupled between the node connection of R12 and R13 and ground potential to provide for a stable signal at such node. The voltage potential appearing at the node connection of R12 and R13 is representative of the current drain (delta current) of the mixer 12 and may be used as a measure of the amplitude of the injection signal supplied to the mixer from the oscillator circuit 10 in that the mixer drain will increase as the injection level is increased.

A narrow bandpass filter having a center frequency set at the desired frequency of the mixer input signal is disposed in the input line and shown as block 52. Variable capacitive tuning elements C14 and C15 are disposed respectively upstream and downstream of filter 52 and coupled to ground. An inductive element L6 is disposed in series with the filter 52. The aforementioned reactive components are provided for additional frequency tuning of the filter 52. In a similar manner, another narrow band frequency filter shown at block 54 is disposed at the output line 28 of the mixer 12 and has a center frequency set at the frequency of the resultant mixer output signal. In summary, then, the primary difference up to this point in the description of the alternate embodiment is that the measurement of the injection signal representative of the amplitude thereof is a delta current measurement of the mixer stage 12 and is taken from the node between the resistor divider connection of R12 and R13 in the collector of the mixer transistor Q4. The measurement signal is connected by signal line 46 to the base of an input transistor stage Q5 of the differential amplifier of the controller circuit 30.

Referring now to the controller circuit 30 of the embodiment depicted in FIG. 3, the input stages are similarly comprised of transistors Q5 and Q6 having their emitters commonly coupled through a common resistor R14 to ground potential. However, the collectors of Q5 and Q6 are directly coupled respectively to the dual collectors of Q11 without the need of the dual differential transistors Q8 and Q7 as described in connection with the embodiment of FIG. 2. Another difference of the controller circuit 30 in the present embodiment is that the reference level of the other input transistor stage Q6 is set by a resistor divider network comprising resistors R15 and R16 coupled in series coupled between the B+supply and the ground potential. The resistor divider network of R15 and R16 provides a precise voltage reference level at the node connection thereof which is coupled to the base of the other input transistor stage Q6 of the differential amplifier. Since this reference level is representative of the desired amplitude, the injection signal may be precisely amplitude controlled with a minimum of bias current supply.

The bias current source 16 comprises a similar mirror circuit arrangement comprising similar transistors Q1 and Q2 with the collector of Q2 being coupled to the oscillator circuit 10 to control the bias current supply thereto. In this alternate embodiment, a resistor R17 is coupled between the current mirror circuit and the B+ supply for setting a minimum bias current supply to the oscillator circuit 10 to ensure against loss of injection signal under all oscillator operating conditions. A current adjusting resistor R18 is coupled between the emitter of Q1 and ground potential. As part of the control of the bias current, the differential amplifier of the control circuit 30 includes a circuit stage comprising a dual collector PNP transistor Q13 having one of its collectors tied to its base which is in turn coupled to the collector of the input stage transistor Q5. The emitter of Q13 is coupled to the B+ supply and the other collector thereof is coupled to the current mirror circuit of Q1 and Q2 for controlling the amount of bias current being supplied to the oscillator circuit 10. The maximum governing current through Q13 which may be adjusted by the value of R14 sets the maximum bias current supply via Q1-Q2 to the oscillator circuit 10. Accordingly, a non-zero bias current range is created between the minimum setting of bias resistor R17 and maximum setting of the governing current of Q13, which maximum setting ensures proper power start-up of the oscillator circuit 10.

In operation, the control circuit 30 is governed by the measured signal over line 46 and the reference potential set by the resistor divider network R15 and R16 such that when the measured signal is below the reference level, governing current is conducted through Q13 to the bias current source circuit 16 to increase the bias current supply to the oscillator circuit 10 which renders an increase in amplitude of the injection signal generated thereby. Conversely, when the measured signal becomes greater than the reference level, less current is conducted through Q13 reducing the bias current supply to the oscillator circuit, thus rendering a lower amplitude of the injection signal. The control circuit 30 is set with tight enough control loop parameters to control the amplitude of the injection signal substantially at the desired level. Further, at re-energization, the maximum bias current supply is applied to the oscillator to ensure proper start up of the oscillator circuit 10. Accordingly, after energization and once steady state conditions prevail with the amplitude of the injection signal at the desired level, the control circuit 30 governs the bias current supplied to the oscillator circuit to a minimum level necessary to maintain the desired amplitude of its generated injection signal. Typical values for the circuit elements of the embodiment of FIG. 3 are shown in the following table:

TABLE 2

| Element | Value |
|---------|-------|
| R1 | 20K ohms |
| R9 | 100 ohms |
| R10 | 15K ohms |
| R11 | 3K ohms |
| R12 | 1K Ohms |
| R13 | 1.8K Ohms |
| R14 | 4K ohms |
| R15 | 20K ohms |
| R16 | 80K ohms |
| R17 | 30K ohms |
| R18 | 3K ohms |
| C1 | 80 pf |
| C2 | 30 pf |
| C4 | .01 uF |
| C11 | .1 uF |
| C12 | .1 uF |
| C13 | .1 uF |
| C14 | 2-10 pf |
| C15 | 2-10 pf |
| L5 | 4.2 uH |
| L6 | 2.6 uH |
| 52 | 17.9 MHz (crystal filter) |
| 54 | 455 KHz (ceramic filter) |
| 20 | 17.445 MHz (fundamental crystal) |

Figure 4:
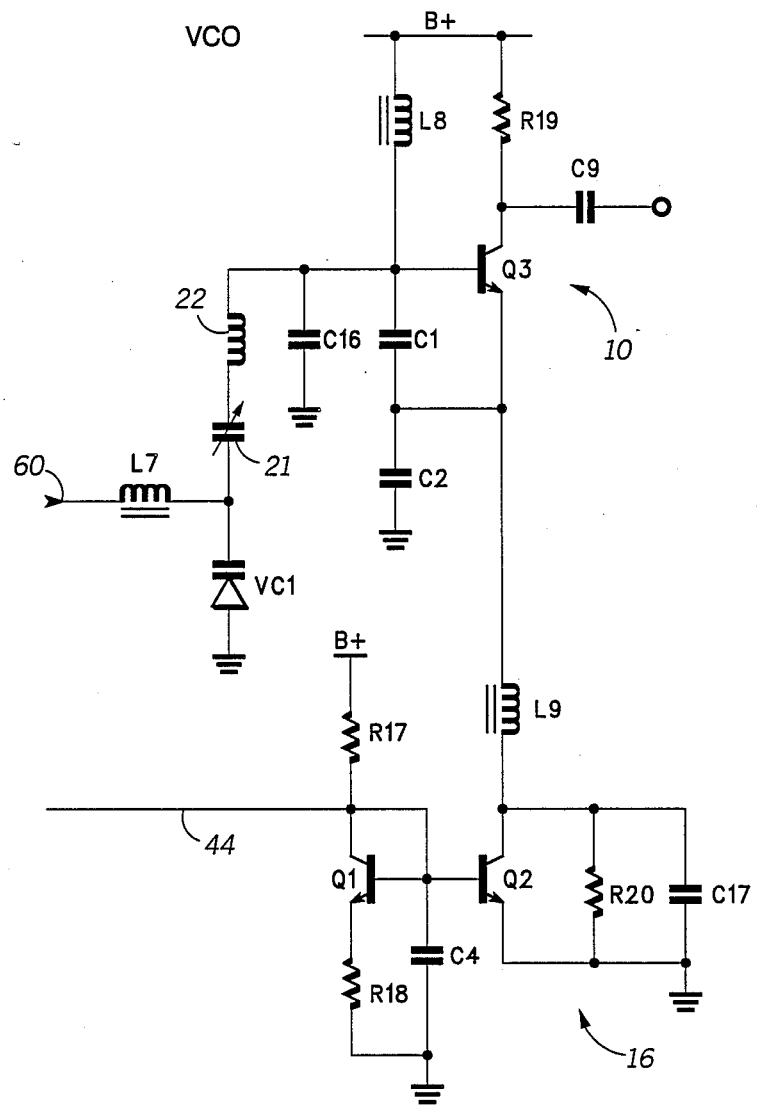
FIG. 4 is a circuit schematic of an alternate local oscillator circuit suitable for use in either of the embodiments of FIGS. 2 and 3.

While the embodiments of FIGS. 2 and 3 were described using a crystal controlled oscillator circuit, this is not the case for all heterodyne stages of a receiver. Some stages may use another type of oscillator circuit, such as a voltage controlled oscillator (VCO), for example. A suitable circuit embodiment of a VCO for use in a heterodyne stage embodying the invention is shown in FIG. 4. The VCO embodiment includes a conventional Colpitts oscillator circuit 10 similar to the oscillator circuit described in connection with the depictions of FIGS. 2 and 3. Reference numerals are maintained for the same or similar elements. Instead of being driven by a tuned crystal circuit, the frequency of the Colpitts oscillator 10 is governed by a varactor or varicap element VC1 which is coupled between the variable capacitor 21 and ground potential. A choke coil L7 is coupled between the node connection between 21 and VC1 and a variable source of voltage potential at 60. Further, a fixed capacitor element may be coupled between the base of Q3 and ground potential to provide additional oscillator tuning. Still further, a choke coil L8 is disposed between the base of Q3 and B+ supply for biasing purposes and for decoupling the B+ supply from the varactor tuned driver stage. A resistor R19 coupled between the collector of Q3 and the B+supply provides both impedance matching and source or local impedance.

A similar current mirror stage comprising transistors Q1 and Q2 is coupled to the VCO 10 to control the bias current thereof which in turn adjusts the amplitude of the injection signal output AC coupled through capacitor C9. Another choke coil L9 and capacitive C17 are disposed in the bias current line between the oscillator circuit 10 and current mirror 16 to provide AC decoupling of the bias current from the transistor Q2. Resistor R20 sets a minimum current level to ensure that the oscillator has sufficient current under all loop conditions.

In operation, the frequency of the injection signal coupled through C9 to the mixer may be controlled by varying the voltage potential applied to the VCO at 60. For example, varying the voltage at 60 between 0.5 V and 3 V alters the capacitance of VC1 in the present embodiment for 24 to 44 pf which commensurately adjusts the frequency of the oscillator about a center frequency of approximately 150 MHz. Typical values of the circuit elements for a suitable embodiment of a VCO tuned for a center frequency of approximately 150 MHz are shown in the table below.

TABLE 3

| Element | Value |
|---------|-------|
| C1 | 22 pf |
| C2 | 15 pf |
| C4 | .05 uf |
| C9 | 220 pf |
| C16 | 30 pf |
| C17 | 125 pf |
| 21 | 5-35 pf |
| VC1 | 24-44 pf (.5V-3V) |
| L7 | 2.6 uH |
| L8 | 2.6 uH |
| L9 | 2.6 uH |
| 22 | 87 nH |
| R17 | 3 K ohms |
| R18 | 1 K ohms |
| R19 | 50 ohms |
| R20 | 1 K ohms |

In summary, both of the embodiments of the present invention described in connection with the depictions of FIGS. 2 and 3 provide a very ample and viable feedback control loop having the ability to measure the injection signal generated by the oscillator circuit in each case undisturbed by extraneous signals, the ability to set a precise reference level for controlling the injection to a desired amplitude signal which becomes particularly important when using a VCO for which precise channel selectivity is needed and because of the substantial increase in sideband noise when the amplitude of the injection signal deviates from that desired, and a bias current control range to ensure that the closed-loop controller operates within a banded range to start-up and sustain oscillator operation under all operating conditions with a minimum current drain from the battery source.

While the present invention has been described in connection with two specific embodiments, it is understood that additions, deletions, and modifications of these embodiments may be made without deviating from the principles of such invention. Accordingly, the present invention should not be limited to any specific embodiment but rather construed in scope and breadth according to the claims appended hereto.

What is claimed is:

1. A heterodyne stage of a receiver comprising:
source of bias current;
local oscillator circuit responsive to bias current supplied from said source for generating an injection signal at a predetermined frequency and an amplitude based on the amount of bias current supplied;
mixer circuit governed by said injection signal to convert a receiver signal from one frequency to another frequency by a heterodyning process;
means for measuring the amplitude of said injection signal; and
differential amplifier circuit having one transistor stage input coupled to said measuring means to effect a signal representative of the amplitude of said injection signal and another transistor stage input biased at a reference level, and including a circuit stage governed by said amplitude representative signal and said reference level to adjust the amount of bias current supplied to said oscillator circuit by said source within a non-zero bias current range.

2. The heterodyne stage in accordance with claim 1 wherein the measuring means includes means for coupling the injection signal from the local oscillator circuit to the one transistor stage input of the differential amplifier circuit.

3. The heterodyne stage in accordance with claim 1 including a current supply line for governing the supply of bias current to the local oscillator circuit by the bias current source; and wherein the circuit stage of the differential amplifier circuit is coupled to the supply line for diverting to the circuit stage a portion of the current intended for governing the bias current supply to the local oscillator circuit in accordance with the amplitude representative signal of the reference signal and the differential amplifier circuit.

4. The heterodyne stage in accordance with claim 3 wherein the circuit stage comprises a current mirror circuit for setting the maximum amount of diverted governing current from said supply line.

5. The heterodyne stage in accordance with claim 3 wherein the bias current source includes a current mirror circuit disposed in the supply line between a governing current source and the local oscillator circuit for setting the maximum amount of bias current to be supplied to the local oscillator circuit by the bias current source.

6. The heterodyne stage in accordance with claim 1 wherein the differential amplifier circuit is constructed as an integrated circuit; and wherein the integrated circuit areas of the one and another transistor stage inputs of the differential amplifier circuit are preselected to set the reference level thereof.

7. The heterodyne stage in accordance with claim 1 wherein the mixer circuit comprises a common emitter transistor configuration operative to generate a delta current signal representative of the amplitude of the injection signal governing its heterodyne operation; and wherein the measuring means includes means for coupling said delta current signal from the mixer circuit to the one transistor stage input of the differential amplifier circuit.

8. The heterodyne stage in accordance with claim 1 wherein the bias current source comprises a current mirror circuit biased to supply a minimum amount of bias current to the local oscillator circuit; and wherein the circuit stage of the differential amplifier circuit is coupled to the current mirror circuit of the bias current source to adjust the amount of bias current supplied to the local oscillator circuit in accordance with the amplitude representative signal and the reference level of the differential amplifier circuit.

9. The heterodyne stage in accordance with claim 8 wherein the circuit stage comprises a current mirror circuit for setting the maximum amount of bias current for supply to the local oscillator circuit by the bias current source.

10. The heterodyne stage in accordance with claim 1 including a resistor divider network coupled between two voltage potentials for generating a reference voltage signal which is coupled to the other transistor stage input of the differential amplifier circuit for biasing said stage to the desired reference level.

* * * * *